(12) United States Patent
Lim et al.

(10) Patent No.: US 6,495,055 B2
(45) Date of Patent: Dec. 17, 2002

(54) VARIABLE TIME ETCHING SYSTEM ACCORDING TO THE ACCUMULATED NUMBER OF DEVICES BEING PROCESSED AND A METHOD FOR ETCHING IN THE SAME MANNER

(75) Inventors: Jung-Taek Lim, Choongcheongnam-do (KR); Sung-Joon Byun, Choongcheongnam-do (KR); Soo-Won Lee, Choongcheongnam-do (KR); Jin-Soo Kim, Choongcheongnam-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/337,735

(22) Filed: Jun. 22, 1999

(65) Prior Publication Data
US 2002/0088774 A1 Jul. 11, 2002

(30) Foreign Application Priority Data
Sep. 24, 1998 (KR) .............................................. 98-39635

(51) Int. Cl.$^7$ ...................... C03C 25/068; C03C 15/000
(52) U.S. Cl. .............................. 216/93; 216/23; 216/24; 216/84; 216/91
(58) Field of Search .............................. 216/23, 24, 83, 216/84, 91, 93

(56) References Cited
U.S. PATENT DOCUMENTS

| 5,221,421 A | * | 6/1993 | Leibovitz et al. | 156/642 |
| 5,308,447 A | * | 5/1994 | Lewis et al. | 156/626 |
| 5,980,771 A | * | 11/1999 | Cowan | 216/93 |

\* cited by examiner

Primary Examiner—Randy Gulakowski
Assistant Examiner—J Smetana
(74) Attorney, Agent, or Firm—Hae-Chan Park; McGuireWoods LLP

(57) ABSTRACT

An etching system and method. In the method, layers are etched on a plurality of substrates using a single amount of etchant to form a predetermined pattern on each of the layers, wherein an etching period varies according to an accumulated process number of substrates. The system includes an etching equipment including an etching processor for etching layers on a plurality of substrates using a single amount of etchant to form a predetermined pattern on each of the layers, and a loader for temporarily holding cassettes in which the substrates are stored; and a controller for controlling operations of the etching equipment. The etching equipment changes an etching period according to an accumulated process number of the substrates.

4 Claims, 3 Drawing Sheets

VARIABLE TIME ETCHING SYSTEM ACCORDING TO THE ACCUMULATED NUMBER OF DEVICES BEING PROCESSED AND A METHOD FOR ETCHING IN THE SAME MANNER

BACKGROUND OF THE INVENTION (a) Field of the Invention

The present invention relates to an etching system and a method for fabricating microelectronics devices such as a semiconductor device or a liquid crystal display (LCD). More particularly, the present invention relates to an etching system and a method that varies an etching period according to the accumulated number of microelectronics devices being etched.

(b) Description of the Related Art

Microelectronics devices such as a semiconductor device or an LCD are formed by integrating a plurality of minute patterns. The patterns are formed by a variety of fabrication steps, one of which is an etching process. There are two main types of etching in microelectronics fabrication: wet etching and dry etching. A wet etching method uses liquid etchants while a dry etching method uses plasma.

The conventional wet etching process for an LCD will be described hereinafter.

In the LCD manufacturing process, it is necessary to form metal patterns of gate lines and data lines. These metal patterns are etched using an etchant containing nitric acid ($HNO_3$). A large number of LCDs repeatedly use the same etchant of a certain amount in order to reduce the manufacturing costs. However, the more LCDs are etched (in other words, an "accumulated process number" increases) in the same etchant of a certain amount, the less nitric acid component remains in the etchant, resulting in a lowered etching rate. Thus, if LCDs are etched for the same period of time without considering the accumulated process number of substrates that the etchant fabricated, a critical dimension (CD) of the metal patterns increases as the accumulated process number increases.

FIG. 1 shows a graph illustrating a relation between the accumulated process number and the CD in the conventional process for manufacturing an LCD.

In the conventional process for manufacturing an LCD, LCDs are etched for a predetermined amount of time (at an overetching rate), without considering the accumulated process number. As shown in FIG. 1, in the conventional process for manufacturing LCDs, the CD increase has an almost linear relationship with the increase in the accumulated process number. Accordingly, the conventional LCD manufacturing process requires changing the etchant when the accumulated process number reaches a certain value (CDo), e.g., 300 devices, where the CD also reaches its tolerance point.

As a result, the conventional LCD manufacturing method wastes etchants a lot, thereby increasing the overall manufacturing costs.

SUMMARY OF THE INVENTION

The present invention has been made in an effort to solve the above problems.

It is an object of the present invention to provide an etching system and a method for fabricating microelectronic devices that varies the etching period according to the accumulated process number of microelectronic devices that the etching system has handled.

To achieve the above object, the present invention provides an etching system and a method. The method according to the present invention etches the layers on a plurality of substrates using the same etchant of a certain volume to form a pattern on each of the layers, but changes the etching period according to the accumulated process number of substrates.

According to a feature of the present invention, the LCDs are etched at first for a period of T1 until the accumulated process number reaches N substrates, and are etched for a period of T2 when the accumulated process number goes beyond N substrates.

According to another feature of the present invention, the etching period varies for each different accumulated process number.

According to yet another feature of the present invention, substrates are etched using a functional value of a process time with regard to the accumulated process number.

According to still yet another feature of the present invention, optimal etching periods for different accumulated process numbers are obtained through experimental tests, and the optimal etching periods are stored in a memory and used to perform etching.

The etching system includes an etching equipment having an etching processor for etching layers on a plurality of substrates using an etchant to form a predetermined pattern on each of the layers, and a loader for temporarily holding cassettes that store the substrates; and a controller for controlling operations of the etching equipment. The etching equipment changes the etching period according to an accumulated process number of the substrates.

According to a feature of the present invention, the controller transmits to the etching equipment a first operation recipe including a first etching period T1 when the accumulated process number is between 1 and N substrates, and a second operation recipe including a second etching period of T2 when the accumulated process number is N+1 or more substrates; and wherein the etching equipment performs etching according to the first operation recipe and the second operation recipe.

According to another feature of the present invention, the controller receives data corresponding to the accumulated process number from the etching equipment when a cassette is loaded on the loader, and transmits the first operation recipe or the second operation recipe to the etching equipment according to the received data.

According to yet another feature of the present invention, the etching equipment etches substrates using the etching period that varies depending on each different accumulated process number.

According to still yet another feature of the present invention, the etching equipment etches substrates using a functional value of a process time with regard to the accumulated process number, the functional value being stored in a memory, and the etching equipment uses the functional value to perform etching.

According to still yet another feature of the present invention, optimal etching periods for different accumulated process numbers are obtained through tests, and the optimal etching periods are stored in a memory and used for etching by the etching equipment.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

Figure 1:
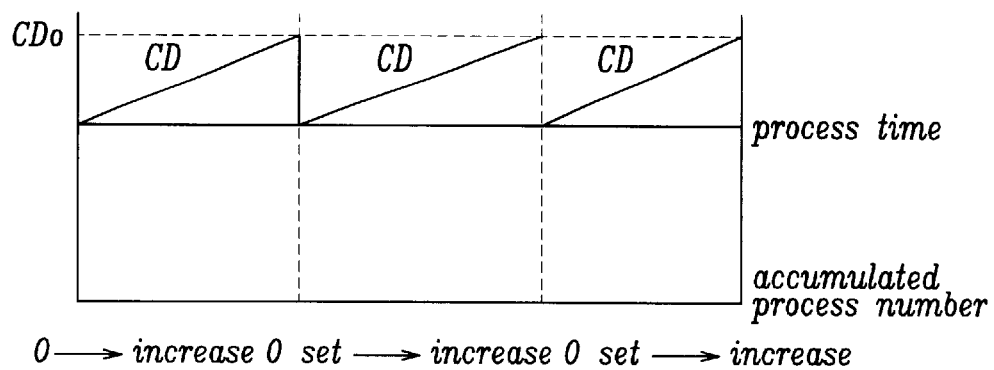
FIG. 1 is a graph illustrating the relationship between an accumulated process number and a CD in the conventional LCD manufacturing process.
Figure 2:
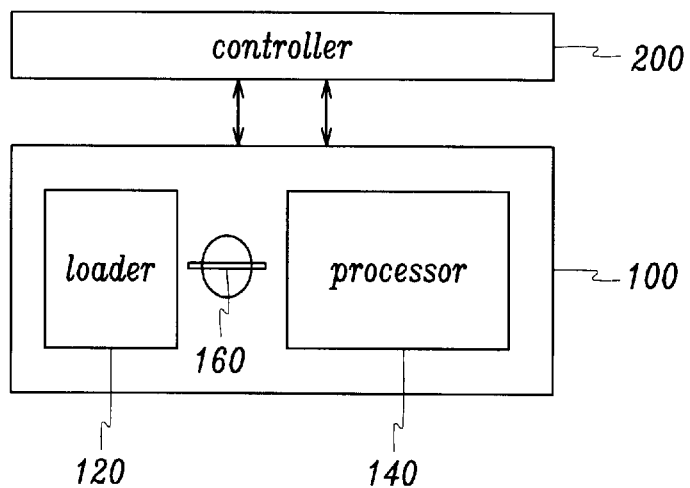
FIG. 2 is a block diagram of an etching system according to a preferred embodiment of the present invention.

FIG. 2 shows a block diagram of an etching system according to a preferred embodiment of the present invention. The etching system comprises an etching equipment 100 and a controller 200. The etching equipment 100 includes a loader 120, an etching processor 140, and a transport robot 160.

The controller 200 of the etching equipment 100 controls operations of the etching equipment 100. In more detail, when a cassette is loaded on the loader 120 of the etching equipment 100 by an automatic transporter (not shown), the loader 120 transmits a signal to inform the controller 200 of the reception of the cassette. The controller 200 then transmits an operation recipe to the etching equipment 100. The operation recipe includes various process conditions such as an etching period, an etchant amount, a time when to replace the etchant, etc. Glass substrates in the cassette are processed according to the operation recipe.

The transport robot 160 of the etching equipment 100 removes from the cassette the glass substrates that require processing in the etching processor 140 and transports the glass substrates to the etching processor 140. The etching processor 140 etches the glass substrates received from the transport robot 160 according to the operation recipe transmitted from the controller 200.

In the present invention, the etching period varies according to an accumulated process number of the glass substrates. The etching period varies by using one of two methods: a method according to a first preferred embodiment of the present invention controls the etching period by the controller 200, and a method according to a second preferred embodiment of the present invention controls the etching period in the etching equipment 100.

Controlling the etching period by the controller 200 will first be described.

When controlling the etching period according to the first preferred embodiment of the present invention, the controller 200 keeps two recipes, each having a different etching period (overetching rate). In more detail, after changing the etchant, an operation recipe of a first etching period T1 (30% overetching rate) is used until the accumulated number of substrates processed by the etchant reaches 400, while an operation recipe of a second etching period T2 (60% overetching rate) is used when the accumulated process number falls between 401 and 1000 glass substrates. The second etching period T2 is longer than the first etching period T1. In this embodiment, T1 is 43 seconds and T2 is 53 seconds for the aluminum etching process. In this way, for substrates are used two operation recipes having etching periods (overetching rates) that varies depending on whether the accumulated process number is less or greater than a predetermined number (400 in this case).

When the cassette is loaded on the loader 120, the controller 200 receives from the etching equipment 100 an accumulated process number corresponding to the number of glass substrates processed in the etching equipment. Using this information, the controller 200 controls the etching equipment 100 such that the substrates are etched using the operation recipe having an overetching rate of 30% when an accumulated process number is 400 or less, or using the operation recipe having an overetching rate of 60% when an accumulated process number is 401 or more.

Figure 3:
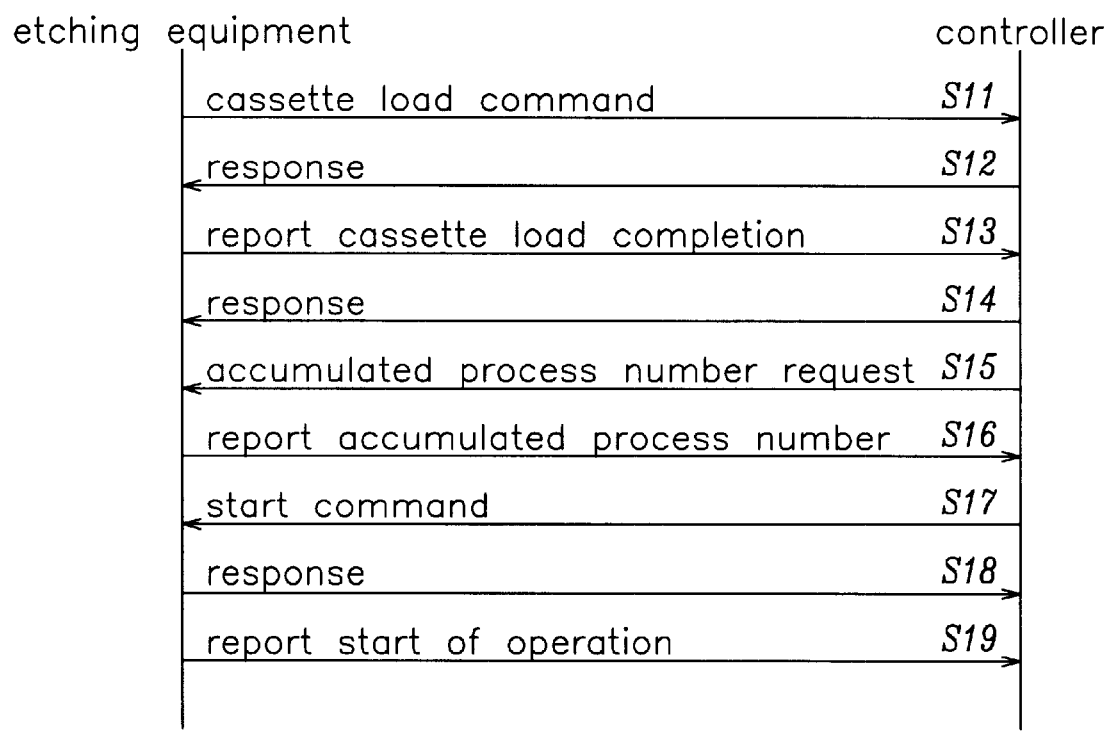
FIG. 3 is a drawing illustrating communications between an etching equipment and a controller shown in FIG. 2.

FIG. 3 shows a drawing illustrating communications between the etching equipment 100 and the controller 200 of FIG. 2. First, the etching equipment 100 sends a cassette load command to the controller in step S11. The controller 200 then searches an internal database to locate an ID of a cassette holding the correct glass substrates that has to be processed, and outputs to the automatic transporter a command to load the correct cassette to the etching equipment 100 in step S12. As a result, the automatic transporter removes the correct cassette from a stocker (not shown) and places the cassette on the loader 120, and then a message reporting the completion of the cassette loading is transmitted to the controller 200 by the etching equipment 100 in step S13.

The controller 200, then, sends a response signal to the etching equipment 100 in step S14, then sends a request to the etching equipment 100 for an accumulated process number of glass substrates in step S15. The etching equipment 100 then calculates the accumulated process number and sends the same to the controller 200 in step S16. Subsequently, the controller 200 sends an operation recipe having an etching period (overetching rate) corresponding to the accumulated process number, and also transmits a start command to the etching equipment 100 in step S17. As a result, the etching controller 100 sends a response signal to the controller 200 in step S18, after which the etching equipment 100 begins to operate and reports to the controller 200 the start of operation in step S19.

In the etching system using the method of controlling the etching period according to the first preferred embodiment of the present invention, at least two operation recipes each having different etching periods are programmed in the controller 200. In this way, after receiving the accumulated process number from the etching equipment 100 at the time of loading, the operation recipe having the etching period suitable for the accumulated process number is transmitted to the etching equipment 100. The glass substrates are processed in the etching equipment 100 according to the operation recipe received from the controller 200.

In the etching system using the method of controlling the etching period according to the first preferred embodiment of the present invention, since the accumulated process number is altered if the etchant is changed when the glass substrates are loaded onto the loader 120, the system automatically stops processing glass substrates. After changing the etchant, the system restarts the processing of the glass substrates using the new operation recipe selected according to the new accumulated process number.

Figure 4:
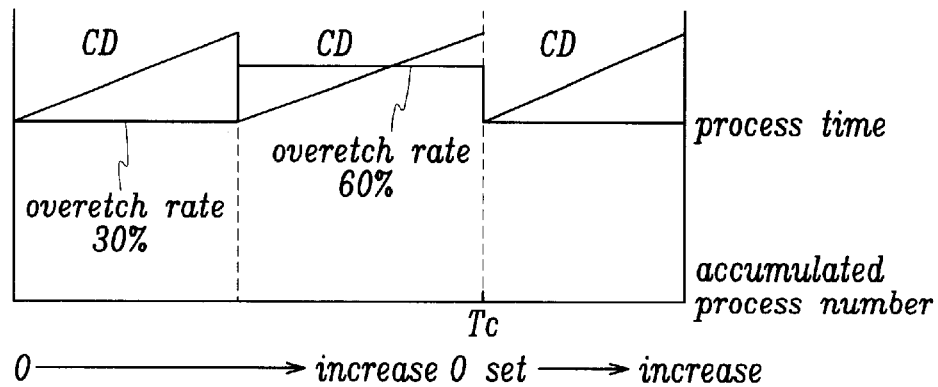
FIG. 4 is a graph illustrating the relationship between an accumulated process number, an etching period and a CD according to a first preferred embodiment of the present invention.

FIG. 4 is a graph illustrating the relationship between the accumulated process number, the etching period and CD according to the first preferred embodiment of the present invention. As shown in the drawing, after the etchant is changed, substrates are etched at an overetching rate (etching period) of 30% when the accumulated process number is between 0 and 400 substrates. In this case, the CD increases at a regular rate as the accumulated process number increases. On the other hand, if the accumulated process number surpasses 400, substrates are etched at an overetching rate (etching period) of 60%. The CD decreases when the accumulated process number is at 401, then starts to increase again as the accumulated process number increases.

As a result, more LCDs can be produced using the same amount of etchant within a predetermined CD range in the present invention than in the prior art.

Table 1 below compares CD values of substrates manufactured according to the prior art method with those manufactured by the method according to the first preferred embodiment of the present invention.

TABLE 1

|  | Accumulated process number | Overetching rate | ACI ($\mu$m) (target 4.1 $\mu$m) |
|---|---|---|---|
| Prior Art | 1–1000 substrates | 30% | 4.312 |
| First preferred | 1–400 substrates | 30% | 4.131 |
| embodiment | 401–1000 substrates | 60% | 4.080 |
|  | average |  | 4.105 |

As is shown in Table 1 above, in the prior art method, substrates are etched at an overetching rate of 30% regardless of the accumulated process number of substrates, and an ACI (after cleaning inspection) value of 4.312 $\mu$m is obtained. The ACI of 4.312 $\mu$m is 0.212 $\mu$m greater than a target value of 4.1 $\mu$m On the other hand, in the method according to the first preferred embodiment of the present invention, at an accumulated process number of between 1 and 400 substrates, substrates are etched at an overetching rate of 30%, while the overetching rate is increased to 60% at an accumulated process number of between 401 and 1000 substrates. Respective ACI values are 4.131 $\mu$m and 4.080 $\mu$m, with an average ACI value of 4.105 $\mu$m. Therefore, it is evident that the target value of 4.1 $\mu$m is realized in the present invention.

The method according to the second preferred embodiment of the present invention that controls the etching period in the etching equipment 100 will be described hereinafter.

According to the second preferred embodiment of the present invention, the etching equipment 100 is provided with an offset program to automatically adjust the etching period (overetching rate) within a single operation recipe according to the accumulated process number. That is, rather than changing the operation recipe (i.e., etching period) for a group of substrates in a non-continuous fashion as in the first preferred embodiment, the etching period changes within a single operation recipe to correspond to changes in the accumulated process number. Accordingly, since substrates can be etched using a single operation recipe, an identical operation recipe is used to process all the glass substrates supplied to the loader 120.

It is possible to use two different variations of the method of the second preferred embodiment of the present invention. In the first variation, substrates are etched using a functional value of the process time with regard to the accumulated process number. In the second variation, optimal etching periods for different accumulated process numbers are obtained from testing, and these values are stored in a memory. The stored etching periods are used by the etching equipment 100 to etch the glass substrates.

Figure 5:
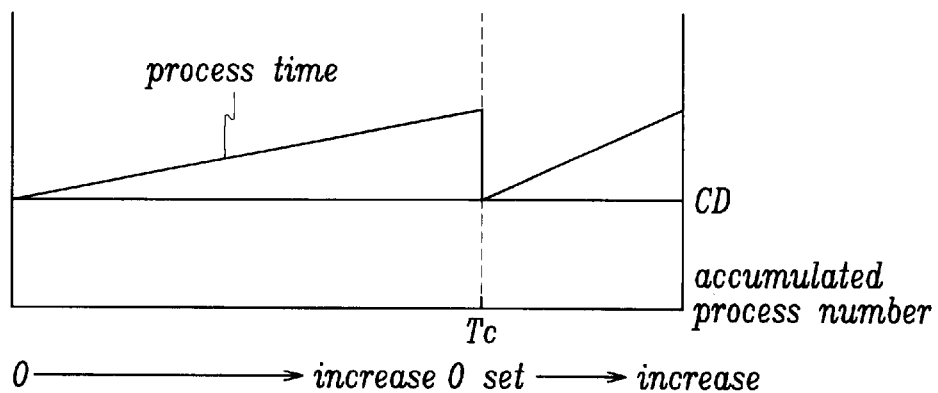
FIG. 5 is a graph illustrating the relationship between an accumulated process number, an etching period and a CD according to a second preferred embodiment of the present invention.

FIG. 5 shows a graph illustrating the relationship between the accumulated process number, etching period and CD according to the second preferred embodiment of the present invention. Using the method according to the second preferred embodiment of the present invention, after the etchant is changed, etching periods are increased according to increases in the accumulated process number such that the CD is maintained at a constant level. Accordingly, more LCDs can be produced within a predetermined CD range in the present invention than in the prior art.

In the etching system and method of the present invention described above, since the etching period varies according to the accumulated process number, the number of substrates that can be fabricated with a certain amount of etchant is increased.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

For example, in the first preferred embodiment of the present invention, although two operation recipes having different etching periods were described, those skilled in the art will readily recognize that three or more operation recipes can be applied to this embodiment. Also, the present invention can be applied to semiconductor devices, etc. and is in no way limited to using with LCDs.

What is claimed is:

1. A method for etching a plurality of substrates with an etchant to form a predetermined pattern on each of the substrates, comprising the steps of:

predetermining an etching period for each of the substrates, wherein the etching period for each of the substrates varies according to an accumulated number of substrates processed by the etchant; and applying the etchant to each of the substrates for the etching period to form the predetermined pattern thereon, wherein one of the etching period is T1 when the accumulated number of substrates processed by the etchant is between 1 and N substrates, and another etching period T2 when the accumulated number of substrates processed by the etchant is more than N substrates.

2. The method of claim 1, wherein the substrates are LCD substrates.

3. A method for etching a plurality of substrates with an etchant to form a predetermined pattern on each of the substrates, comprising the steps of:

predetermining an etching period for each of the substrates, wherein the etching period varies depending on each different accumulated number of substrates processed by the etchant; and applying the etchant to each of the substrates for the etching period to form the predetermined pattern thereon.

4. The method of claim 3, wherein optimal etching periods for a range of different accumulated numbers of substrates processed in the etchant are calculated and employed for etching.

* * * * *